United States Patent
Ahn et al.

[11] Patent Number: 6,058,023
[45] Date of Patent: May 2, 2000

[54] ISOLATION OF HIGH-VOLTAGE COMPONENTS IN A DENSE ENVIRONMENT

[75] Inventors: James J. Ahn, Downey; John F. Stickelmaier, Manhattan Beach, both of Calif.

[73] Assignee: Hughes Electronics Corporation, El Segundo, Calif.

[21] Appl. No.: 09/187,250

[22] Filed: Nov. 6, 1998

[51] Int. Cl.$^7$ ................................. H05K 7/02; H05K 7/04
[52] U.S. Cl. ........................ 361/807; 361/808; 361/809; 257/711
[58] Field of Search .................................. 361/808, 809, 361/707, 717–720, 807; 257/711, 707; 174/52.5, 138 G; 438/106, 121, 122; 29/832, 854; 333/247

[56] References Cited

U.S. PATENT DOCUMENTS

| | | |
|---|---|---|
| 4,069,498 | 1/1978 | Joshi ........................................ 257/707 |
| 4,538,124 | 8/1985 | Morrison ................................... 333/246 |
| 4,830,678 | 5/1989 | Todorof et al. .......................... 136/259 |
| 4,887,248 | 12/1989 | Griebeler ................................ 367/181 |
| 5,012,386 | 4/1991 | McShane et al. ........................ 361/715 |
| 5,465,470 | 11/1995 | Vongfuangfoo et al. ................. 29/559 |
| 5,602,720 | 2/1997 | Natsuhara et al. ...................... 257/711 |
| 5,652,696 | 7/1997 | Traylor et al. ........................... 361/764 |
| 5,812,375 | 9/1998 | Casperson ............................... 361/719 |
| 5,818,098 | 10/1998 | Davies et al. ........................... 257/506 |

*Primary Examiner*—Leo P. Picard
*Assistant Examiner*—John B. Vigushin
*Attorney, Agent, or Firm*—Terje Gudmestad; M. W. Sales

[57] ABSTRACT

An electronic component operating at high voltage is mounted to the top side of an insulating platform, which in turn is supported from a chassis by a pedestal. The insulating platform provides a long surface path conduction distance of the electronic component to the chassis and to other components mounted to the chassis. The platform-mounted electronic component is thereby insulated against arcing and damaging the other components.

18 Claims, 2 Drawing Sheets

ISOLATION OF HIGH-VOLTAGE COMPONENTS IN A DENSE ENVIRONMENT

BACKGROUND OF THE INVENTION

This invention relates to the mounting of electronic components, and, more particularly, to the insulation of high-voltage electronic components from adjacent components.

In many electronic systems, a number of electronic components are mounted to a chassis. There is often a wide range of voltages associated with the mounted components and the chassis. The electronic components themselves may operate over a wide range of voltages, with some functioning at low voltage and others at high voltage. The chassis and/or some of the components may be grounded. These components operating over a wide range of voltages must be electrically insulated from each other and from ground to prevent arcing that can damage the components that may arc and the surrounding components.

Two approaches are used to achieve the insulation. In one, an insulating material having a high electrical breakdown voltage per unit thickness of material is placed between the portions of the electronic system that operate at different voltages. If the voltage difference is large, the required thickness of insulating material is great, and there is substantial added weight to the electronic system. In the second approach, the portions of the electronic system operating at different voltages are spaced sufficiently far apart that arcing is suppressed. If the voltage difference is large, the required spacing is great, and there is substantial added size, volume, and weight in the electronic system.

In some applications, added weight and/or volume are not of concern. In other cases, such as spacecraft to be launched into orbit, weight and volume are at a premium, and every effort must be made to reduce the weight and volume of the electronic system. There is therefore a need for an improved approach to the structure of electronic systems having components operating over a wide range of voltages. The present invention fulfills this need, and further provides related advantages.

SUMMARY OF THE INVENTION

The present invention provides a constructional approach for an electronic device structure wherein different electronic components are at widely varying voltages during operation. The electronic device structure of the present approach has less added weight and volume than prior techniques for packaging such circuitry. The structure may be tailored according to the operating voltages of the components for minimum added weight and volume.

In accordance with the invention, an electronic device structure comprises a chassis and a pedestal structure supported on the chassis. The pedestal structure comprises a pedestal extending upwardly from the chassis with a pedestal top, and a platform made of an insulating material. The platform is attached to the top of the pedestal and extends laterally from the pedestal top. An electronic component is mounted to a top face of the platform remote from the pedestal.

The pedestal raises the pedestal-mounted electronic component out of the plane of the chassis and other electronic components that are surface-mounted to the chassis. The insulating platform and the pedestal in combination provide a long surface-measured closest approach distance between the platform-mounted electronic component operating at high voltage and the chassis surface, and between the platform-mounted electronic component and adjacent electronic components. It also provides a tortuous breakdown path for any arcing. These effects in combination allow the electronic device structure to be lighter in weight and smaller in size than in prior approaches where insulation thickness and linear separation are relied upon for prevention of electrical breakdown.

Stated alternatively, an electronic device structure comprises a chassis having a substantially planar chassis surface, and an electronic component supported from the chassis surface at a location remote from the chassis surface and out of the plane of the chassis surface. The electronic component operates at a voltage difference of V volts relative to an adjacent portion of the electronic device structure. An insulator is interposed between the electronic component and the planar chassis surface. The insulator has a surface-path-measured closest approach distance between the electronic component and the adjacent portion of the electronic device structure of at least about V/75 mils. This value is based upon the experimental observation that breakdown occurs along a surface-path conduction path when the voltage difference along that surface-measured path exceeds about 75 times the distance in mils (thousandths of an inch) measured along the path for many materials. The value may be slightly different for some other materials.

The present invention thus provides an electronic device structure wherein large operating voltage differences are accommodated without great added weight and size. The electronic device structure may be tailored as necessary according to the voltage differences, the numbers of devices, and other specific features of the system. Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

BRIEF DESCRIPTION OF THE DRAWINGS

FIGS. 2A–2C are sectional views of the electronic device structure of FIG. 1, taken along lines 2—2, illustrating several embodiments of the pedestal/platform structure, wherein FIG. 2A illustrates a pedestal integral with the chassis, FIG. 2B illustrates a pedestal that is not integral with the chassis, and FIG. 2C illustrates a finned pedestal;

DETAILED DESCRIPTION OF THE INVENTION

Figure 1:
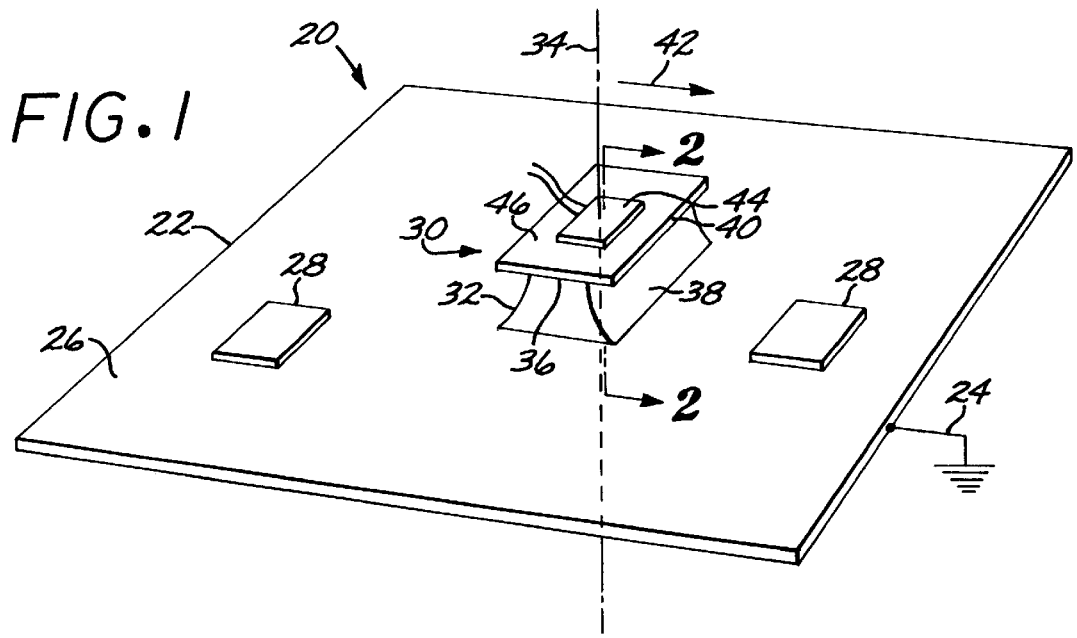
FIG. 1 is a perspective view of an electronic device structure according to the invention.

FIG. 1 depicts an electronic device structure 20 according to the invention. The structure 20 includes a chassis 22 which may be made of any operable material. For the illustration, the chassis 22 is depicted as being made of metal which may be grounded by an electrical ground 24. The chassis 22 may instead be made of an insulator. The chassis 22 is mounted in a rack or other support structure (not shown). The preferred chassis 22 has an upper surface 26 which is generally planar. One or more surface-mounted electronic components 28 are usually mounted to the upper surface 26 of the chassis 22.

A pedestal structure 30 is supported on the chassis 22. The pedestal structure 30 includes a pedestal 32 which extends upwardly from the upper surface 26 of the chassis 22 along a pedestal axis 34 that is preferably generally perpendicular to the upper surface 26 of the chassis 22. The pedestal 32 has a pedestal top 36 and pedestal sides 38. A platform 40 is attached to the top 36 of the pedestal 32. The platform 40 is made of an insulating material. The insulating material preferably has a bulk electrical resistivity of at least about $10^5$ microhm-cm. Operable insulating materials for the platform 40 include ceramics such as aluminum oxide, beryllium oxide, glass, and electrically insulating composite materials such as fiberglass. The platform 40 extends laterally (i.e., in a direction 42 parallel to the upper surface 26 of the chassis 22 and perpendicular to the pedestal axis 34) from the pedestal axis 34 to a greater distance from the pedestal axis 34 than the pedestal sides 38. A pedestal-mounted electronic component 44 is mounted to a top face 46 of the platform 40 remote from the pedestal 32. For the preferred applications of the present invention, the electronic component 44 has an operating voltage difference V of from about 300 volts to about 10,000 volts relative to the chassis 22 and the components 28.

Figure 2A:
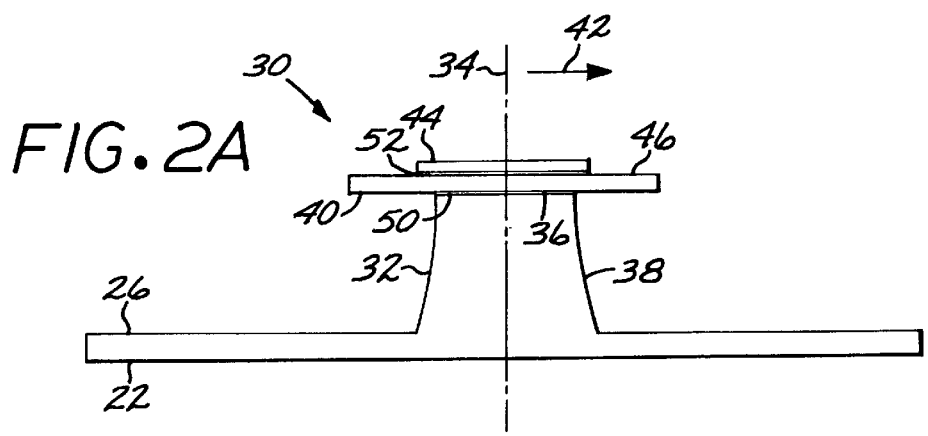
Figure 2B:
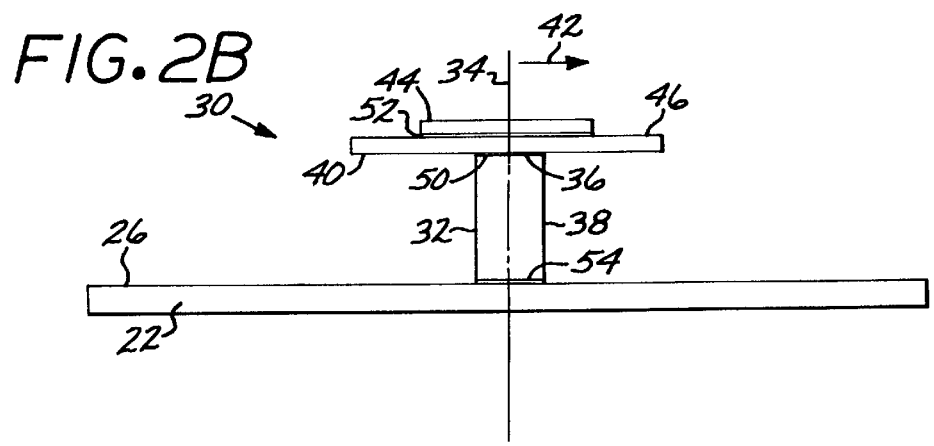
Figure 2C:
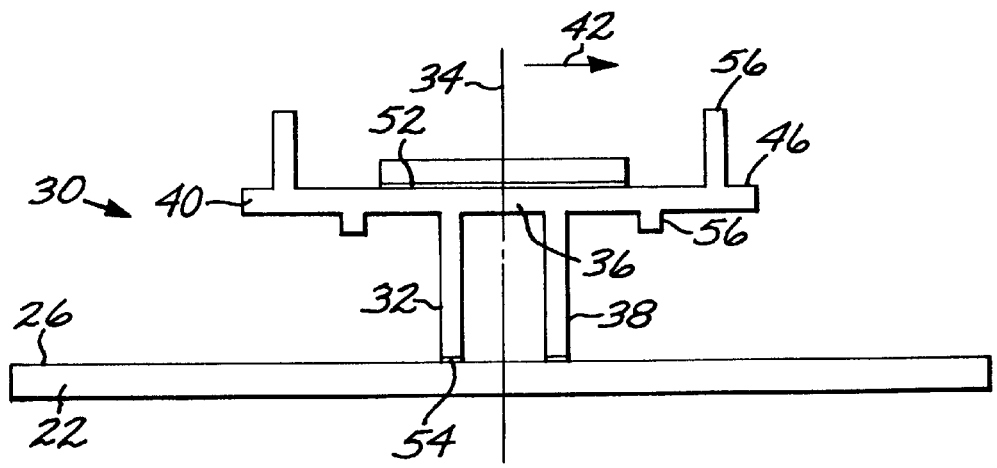

FIGS. 2A–2C illustrate several configurations of the pedestal structure 30. The basic elements are as described in relation to FIG. 1, and the previous discussion and reference numerals are incorporated here.

In the embodiment of FIG. 2A, the pedestal 32 is integral with the chassis 22 and made of the same material. For example, where the chassis 22 is a metal such as aluminum, the pedestal 32 would be integral with the chassis 22 and also made of aluminum. The pedestal 32 of this embodiment may be made by any operable technique, such as machining or stamping integral with the chassis. The platform 40 is bonded to the pedestal top 36 by any operable technique, with adhesive bonding at a bond joint 50 preferred. The pedestal-mounted electronic component 44 is bonded to the platform 40 by any operable technique, with adhesive bonding at a bond joint 52 preferred.

In the embodiment of FIG. 2B, the pedestal 32 is not integral with the chassis 22, and is initially provided as a separate element. The pedestal 32 of FIG. 2B may be the same material as the chassis 22, but more preferably is a different material. The pedestal 32 of FIG. 2B may be an electrical conductor such as a metal, or an electrical insulator such as a ceramic, a glass, or an electrically non-conductive composite material. The pedestal 32 of FIG. 2B is bonded to the upper surface 26 of the chassis 22 by any operable technique, with adhesive bonding at a bond joint 54 preferred. The pedestal 32 is bonded to the platform 40 by the bond joint 50.

In the embodiment of FIG. 2C, the pedestal 32 is not integral with the chassis 22, and in addition is hollow to reduce the weight of the pedestal structure 30. In this case, the pedestal 32 is integral with the platform 40, and is made of the same material as the platform 40. The platform 40 has a number of projections 56 thereon, which may also be viewed as fins. The projections 56 are not intended primarily to be cooling fins (although they may incidentally perform a cooling fin function), but instead serve to increase the surface voltage breakdown resistance of the pedestal structure 30 by providing a tortuous breakdown path, as will be discussed more fully subsequently. A complexly shaped, hollow pedestal structure 30 such as shown in FIG. 2C may be readily fabricated from ceramic material by injection molding and other comparable processes. The pedestal structure 30 is adhesively bonded to the chassis 22, and the pedestal-mounted electronic component 44 is adhesively bonded to the platform 40.

The various features of the pedestal structures described in relation to FIGS. 2A–2C may be combined in any operable manner.

Figure 3:
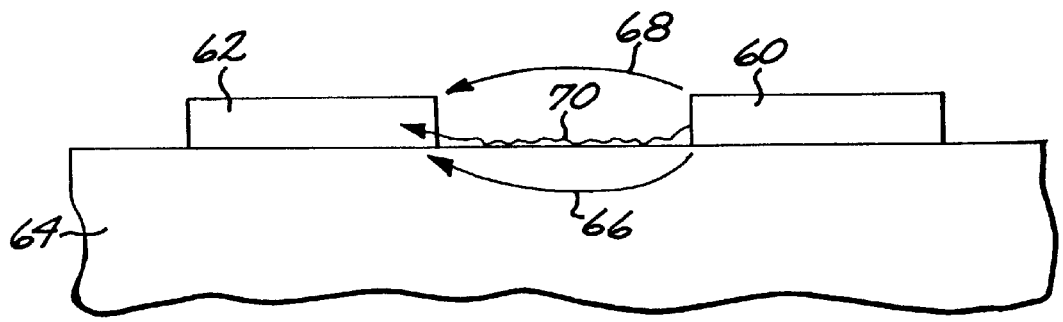
FIG. 3 is a schematic view of two electronic components on a substrate, illustrating the three major voltage breakdown paths.
Figure 4:
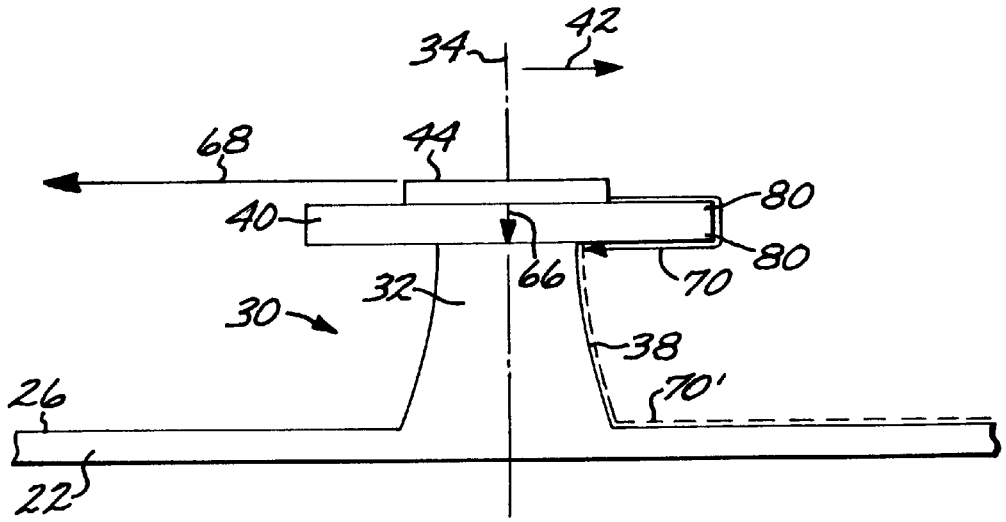
FIG. 4 is a schematic sectional view of the first embodiment in the same view as FIG. 2A, illustrating the three major voltage breakdown paths.

FIGS. 3 and 4 illustrate the physical basis of the present invention. FIG. 3 illustrates a first electronic component 60 and a second electronic component 62 mounted on a substrate 64. If the first electronic component 60 operates at a substantially higher voltage than the second electronic component 62, there are three paths by which there may be a breakdown that leads to current flow and/or arcing from the first electronic component 60 to the second electronic component 62. The first path 66 is a solid conduction path through the substrate 64. If the substrate 64 is an insulator, it prevents such conduction along the first path 66 up to its dielectric strength, which is a measure of the maximum applied voltage to which the material resists a catastrophic breakdown of its insulation properties, typically expressed in volts per thousandths of an inch (mils) of insulator material. That is, the greater the thickness or length of material measured along the potential electrical breakdown path, the greater the voltage it supports without breakdown. Typical ceramics, plastics, and other electrical insulators have dielectric strengths in the range of up to about 800 volts per mil. If the substrate 64 is a metal, an insulator is placed between the components and the substrate to inhibit through-thickness conduction along the first path 66.

The second path 68 is a free-space conduction path through air, vacuum, or other non-solid medium separating the components 60 and 62. Typical free-space dielectric strengths are on the order of 300 volts per mil.

The third path 70 is a surface conduction path along the surfaces between the components 60 and 62, in this case the surface of the substrate 64. The surface conduction path 70 is measured along the insulator surface (not counting any conducting surface) as a closest approach surface-path conduction distance to a neighboring region of different voltage. Surface conduction paths 70 typically have a relatively low dielectric strength of about 75 volts per mil for a number of insulating materials. That is, the surface conduction path 70 is the most likely voltage breakdown path in many cases of practical interest. For those cases, the length of the surface path conduction distance measured in mils must be at least V/75, where V is the operating voltage difference of a component relative to an adjacent region of the electronic device structure.

To prevent voltage-induced breakdown along the surface path 70, the distance between the components 60 and 62 may be increased, resulting in a laterally larger and heavier structure.

The corresponding paths 66, 68, and 70 for the configuration of the present invention are illustrated in FIG. 4. The solid conduction path 66 is through the thickness of the platform 40 for the case where the pedestal 32 is a metal and the chassis 22 is a metal (FIG. 2A). However, the solid conduction path may be greatly increased in length, if necessary, by making the pedestal 32 of an insulator such as a ceramic, as in some embodiments of FIGS. 2B and 2C. The free-space conduction path 68 is through the non-solid medium, and is generally not a concern because the free-space dielectric strength is ordinarily quite high.

The use of the platform 40 substantially increases the effective dielectric strength along the surface conduction third path 70, by two mechanisms. First, the distance in mils measured along the insulating surface, but not counting the path length along the surface of any conducting material (as indicated by the curved path 70) between the pedestal-mounted electronic component 44 and any other area of different voltage potential is increased due to the width of the platform 40. The greater the transverse dimension of the platform 40 in the direction 42, the greater the resistance to breakdown along the third path 70. The distance along the third path 70 may be made even greater by constructing the pedestal 38 of an electrical insulator, as in some of the embodiments of FIGS. 2B and 2C, or making the chassis 22 of an electrical insulator, see path extension 70' in FIG. 4.

Second, the presence of the right-angle corners 80 at the outward periphery of the platform 40 effectively decreases the electric field stress applied along the third path 70, thereby in effect increasing the dielectric strength along the surface path 70. The addition of the projections 56, as in FIG. 2C, has this same result of increasing the dielectric strength along the surface path 70 by creating an even-more tortuous surface conduction breakdown path.

The use of the pedestal structure 30 thus increases the resistance to electrical breakdown along the surface path 70. The result, as shown in FIG. 1, is that the components 44 and 28 may be spaced more closely together, without risking electrical breakdown if one of the components 28 and 44 operates at a substantially different voltage than the other. The thickness of the electronic device structure 20 is slightly greater as a result of the pedestal height, but in many cases this small increase in thickness dimension is of little practical concern.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. An electronic device structure, comprising:
    a chassis;
    a pedestal structure supported on the chassis, the pedestal structure comprising
        a pedestal extending upwardly from the chassis, and further having a pedestal top, and
        a platform made of an insulating material and attached to the top of the pedestal;
    an electronic component mounted to a top face of the platform remote from the pedestal; and
    a plurality of additional electronic components mounted to the chassis and not to the platform.

2. The electronic device structure of claim 1, wherein the chassis is made of a metal.

3. The electronic device structure of claim 1, wherein the pedestal is made of a second insulating material.

4. The electronic device structure of claim 3, wherein the insulating material and the second insulating material are the same material.

5. The electronic device structure of claim 1, wherein the electronic component has an operating voltage difference relative to the chassis of from about 300 volts to about 10,000 volts.

6. The electronic device structure of claim 1, wherein the pedestal is integral with the chassis and made of the same material as the chassis.

7. An electronic device structure, comprising:
    a chassis;
    a pedestal structure supported on the chassis, the pedestal structure comprising
        a pedestal extending away from the chassis along a pedestal axis and having pedestal sides, and
        a platform supported on the pedestal, the platform being made of an insulating material and extending laterally away from the pedestal axis to a greater distance than the pedestal sides;
    an electronic component mounted to a face of the platform remote from the pedestal; and
    a plurality of additional electronic components mounted to the chassis.

8. The electronic device structure of claim 7, wherein the chassis is made of a metal.

9. The electronic device structure of claim 7, wherein the pedestal is made of a second insulating material.

10. The electronic device structure of claim 9, wherein the insulating material and the second insulating material are the same material.

11. The electronic device structure of claim 7, wherein the electronic component has an operating voltage difference relative to the chassis of from about 300 volts to about 10,000 volts.

12. The electronic device structure of claim 7, wherein the pedestal is integral with the chassis and made of the same material as the chassis.

13. An electronic device structure, comprising:
    a chassis having a substantially planar chassis surface;
    an electronic component supported from the chassis surface at a location remote from the chassis surface and out of the plane of the chassis surface, the electronic component operating at a voltage difference of V volts relative to an adjacent region of the electronic device structure; and
    an insulator interposed between the electronic component and the planar chassis surface, the insulator having a surface-measured closest approach surface-path conduction distance to a neighboring region of different voltage of at least about V/75 mil.

14. The electronic device structure of claim 13, wherein the insulator has at least one right-angle corner in each direction of measurement of the closest approach surface-path conduction distance.

15. The electronic device structure of claim 13, wherein the insulator has at least two right-angle corners in each direction of measurement of the closest approach distance.

16. The electronic device structure of claim 13, wherein the insulator comprises
    a pedestal supported on the chassis surface, and
    a platform supported on the pedestal, and wherein the electronic component is mounted to a surface of the platform remote from the pedestal.

17. An electronic device structure, comprising:
    a chassis;
    a pedestal structure supported on the chassis, the pedestal structure comprising
        a pedestal extending upwardly from the chassis, and further having a pedestal top, wherein the pedestal is made of an insulating material, and
        a platform made of the same insulating material as the pedestal, the platform being attached to the top of the pedestal and extending laterally from the pedestal top; and an electronic component mounted to a top face of the platform remote from the pedestal.

18. An electronic device structure, comprising:

a chassis;

a pedestal structure supported on the chassis, the pedestal structure comprising a pedestal made of an insulating material and extending away from the chassis along a pedestal axis and having pedestal sides, and a platform supported on the pedestal, the platform being made of the same insulating material as the pedestal and extending laterally away from the pedestal axis to a greater distance than the pedestal sides; and an electronic component mounted to a face of the platform remote from the pedestal.

* * * * *